(12) United States Patent
Mayes

(10) Patent No.: US 6,723,172 B2
(45) Date of Patent: Apr. 20, 2004

(54) METHOD AND SYSTEM FOR PROCESSING SEMICONDUCTOR WAFERS

(75) Inventor: Steven K. Mayes, Anna, TX (US)

(73) Assignee: Texas Instruments Incorporated, Dallas, TX (US)

( * ) Notice: Subject to any disclaimer, the term of this patent is extended or adjusted under 35 U.S.C. 154(b) by 361 days.

(21) Appl. No.: 09/921,214

(22) Filed: Aug. 2, 2001

(65) Prior Publication Data
US 2002/0043274 A1 Apr. 18, 2002

Related U.S. Application Data
(60) Provisional application No. 60/226,365, filed on Aug. 18, 2000.

(51) Int. Cl.$^7$ ................................................ B08B 7/04
(52) U.S. Cl. ..................... 134/18; 134/21; 134/22.18; 134/902; 438/905
(58) Field of Search .......................... 134/18, 34, 37, 134/19, 10, 21, 22.1, 22.18, 902; 15/301.1, 303, 304, 319, 339, 405, 406; 438/905

(56) References Cited

U.S. PATENT DOCUMENTS

| | | | | |
|---|---|---|---|---|
| 5,690,795 A | * | 11/1997 | Rosenstein et al. | ...... 204/192.1 |
| 5,834,827 A | * | 11/1998 | Miyasaka et al. | ............ 257/578 |
| 6,322,716 B1 | * | 11/2001 | Qiao et al. | ..................... 216/67 |
| 2002/0073925 A1 | * | 6/2002 | Noble et al. | ......... 118/723 ME |

* cited by examiner

Primary Examiner—Alexander Markoff
(74) Attorney, Agent, or Firm—Yingsheng Tung; Wade James Brady, III; Frederick J. Telecky, Jr.

(57) ABSTRACT

A method for processing semiconductor wafers includes processing a semiconductor wafer in a processing chamber having upper and lower chambers, decoupling the upper chamber from the lower chamber, cleaning the upper chamber, determining, while decoupled, that a leak rate and a particle count for the upper chamber meets predetermined criteria, and coupling the upper chamber to the lower chamber.

15 Claims, 2 Drawing Sheets

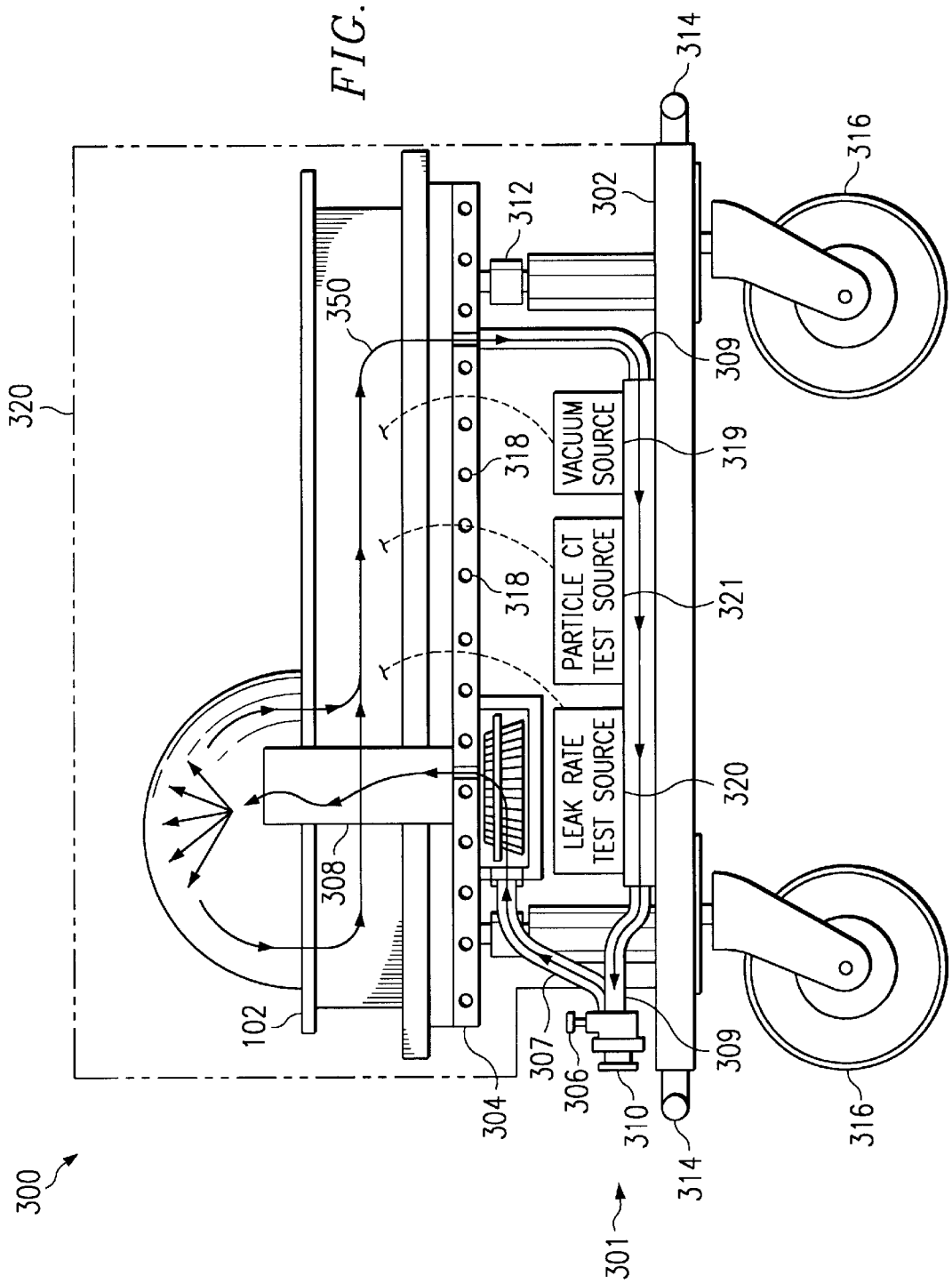

METHOD AND SYSTEM FOR PROCESSING SEMICONDUCTOR WAFERS

This application claims priority under 35 USC §119(e)(1) of provisional application No. 60/226,365 filed Aug. 18, 2000.

TECHNICAL FIELD OF THE INVENTION

This invention relates generally to the field of semiconductors and, more specifically, to a method and system for processing semiconductor wafers.

BACKGROUND OF THE INVENTION

Many fabrication techniques are used for processing semiconductor wafers. One such fabrication technique is plasma etching. The plasma etch process is usually performed in a processing chamber. There are many requirements for processing chambers used for plasma etching and other semiconductor wafer fabrication processes. For example, it is important that vacuum leak rates and particle counts be at, or within, certain levels. Furthermore, processing chambers used for semiconductor wafer processing usually need to be cleaned after they are used. Therefore, semiconductor fabricators strive to process semiconductor wafers at low cost and in a fast and efficient manner.

One way of preparing processing chambers for use is to disassemble them and clean all the parts with a solvent such as alcohol. The processing chamber is then reassembled, coupled to a lower chamber that houses the processing equipment, and then a vacuum is pulled on the processing chamber. Leak rates and particle counts can then be measured to see if they are within acceptable levels. If they are not within acceptable levels, then the processing chamber is taken off the lower chamber and cleaned further. This wastes considerable time and manpower. Another way of cleaning processing chambers is to outgas them in an oven using, for example, a nitrogen gas. Once again, the processing chamber is placed on the lower chamber and the testing of the leak rates and particle counts is performed as described above. What is needed is a method or system to ensure a preconditioned processing chamber before the processing chamber is set up on the lower chamber before being used for processing semiconductor wafers.

SUMMARY OF THE INVENTION

The challenges in the field of semiconductors continue to increase with demands for more and better techniques having greater flexibility and adaptability. Therefore, a need has arisen for a new method and system for processing semiconductor wafers.

In accordance with the present invention, a method and system for processing semiconductor wafers is provided that addresses disadvantages and problems associated with previously developed methods and systems.

A method for processing semiconductor wafers includes processing a semiconductor wafer in a processing chamber having upper and lower chambers, decoupling the upper chamber from the lower chamber, cleaning the upper chamber, determining, while decoupled, that a leak rate and a particle count for the upper chamber meets predetermined criteria, and coupling the upper chamber to the lower chamber.

A mobile system for preconditioning a semiconductor processing chamber having an upper chamber and a lower chamber includes a mobile cart, a hot gas recirculating system coupled to the mobile cart and adapted to couple to the upper chamber, a vacuum source coupled to the cart and adapted to couple to the upper chamber, a leak rate testing source coupled to the cart and adapted to couple to the upper chamber, and a particle count testing source coupled to the cart and adapted to couple to the upper chamber.

Embodiments of the invention provide numerous technical advantages. For example, a technical advantage of one embodiment of the present invention is that there is a reduction in time from when a semiconductor wafer is processed to preconditioning a processing chamber for the next processing cycle. Another technical advantage of one embodiment of the present invention is the reduction of processing variables such as processing chamber vacuum leak rates and processing chamber particle counts. Utilizing one embodiment of the present invention results in a processing chamber being ready for use as soon as one processing cycle is finished using another preconditioned processing chamber. The preconditioned processing chamber is held under vacuum and the leak rates and particle counts are already known; therefore, the processing chamber just needs to be set up and used. Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which:

FIG. 3 is an elevation view of one embodiment of a mobile cart for preconditioning an upper chamber of a processing chamber in accordance with the present invention.

DETAILED DESCRIPTION OF EMBODIMENTS OF THE INVENTION

Figure 1:
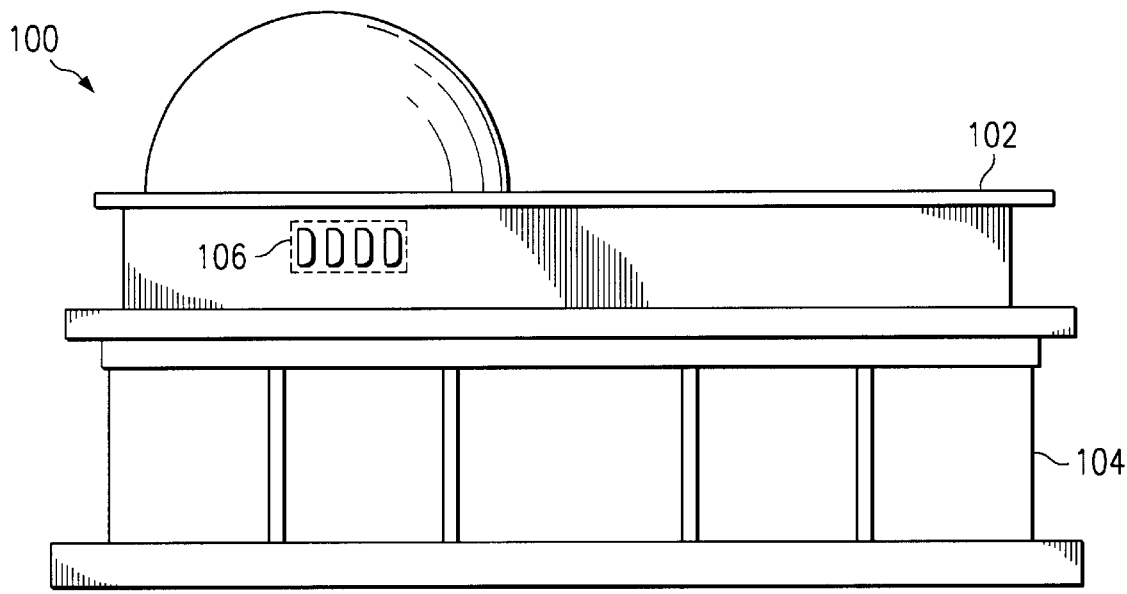
FIG. 1 is an elevation view of one embodiment of a processing chamber having upper and lower chambers for processing semiconductor wafers in accordance with the present invention.
Figure 2:
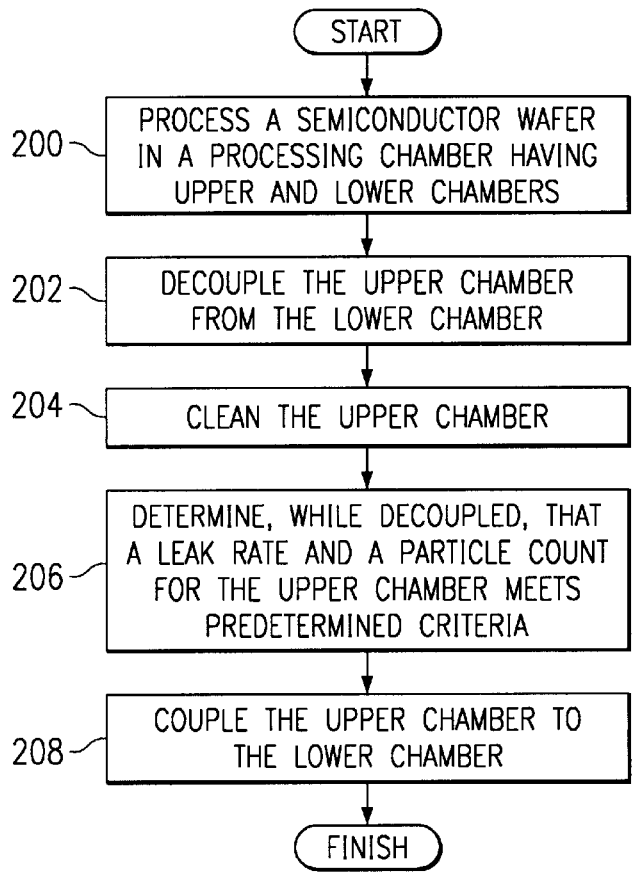
FIG. 2 is a flowchart demonstrating one method of processing semiconductor wafers in accordance with the present invention.

Embodiments of the present invention and their advantages are best understood by referring now to FIGS. 1 through 3 of the drawings, in which like numerals refer to like parts.

FIG. 1 is an elevation view of a processing chamber 100 having an upper chamber 102 and a lower chamber 104 for processing semiconductor wafers 106. One example of processing chamber 100 is the Silicon Etch DPS Plus Centura™ from Applied Materials™. However, other types of processing chambers can be used for many different types of semiconductor wafer processes. One example of such a semiconductor wafer process is plasma etching.

In one embodiment, semiconductor wafers 106 are housed in upper chamber 102, which is where the plasma etch process, or other semiconductor wafer process, is accomplished. Lower chamber 104 is the portion of processing chamber 100 where processing variables, such as pressure, temperature, and RF frequency are produced and/or delivered to upper chamber 102. Since semiconductor wafer processing requires a clean atmosphere, upper chamber 102 needs to be preconditioned before use. Therefore, upper chamber needs to be cleaned periodically, such as after a plasma etch process. Since this normally requires disassembly, removal and/or replacement of parts, cleaning, and reassembly, then significant time is wasted in processing semiconductor wafers. Not only is time wasted, but extra manpower may be required to precondition these processing chambers, thereby wasting additional money and hurting efficiency. Thus, a method of processing semiconductor wafers that is fast and efficient and done at low cost is desired. One such method is shown in FIG. 2.

FIG. 2 is a flowchart illustrating one method for processing semiconductor wafers in accordance with the present invention. A semiconductor wafer 106 is processed in processing chamber 100 having upper chamber 102 and lower chamber 104 at step 200. As described above, this process could be a plasma etch process to, for example, etch polysilicon or metal. After processing semiconductor wafer 106, upper chamber 102 needs to be cleaned. Therefore, upper chamber 102 is decoupled from lower chamber 104 at step 202, and upper chamber 102 is cleaned at step 204.

There are many ways to clean upper chamber 102. For example, upper chamber 102 can be cleaned with a hot gas recirculating system ("HGRS") 301 as shown in FIG. 3, which is well known in the art of semiconductor wafer processing. In one embodiment, HGRS 301 is coupled to a cart 300, which is described in detail below, for the efficient and cost-effective processing of semiconductor wafers. Upper chamber 102 may also be cleaned by outgassing in an oven or by disassembling and cleaning the various parts of upper chamber 102 with a solvent such as alcohol.

After cleaning upper chamber 102 at step 204, upper chamber 102 is reassembled, if necessary, and preconditioned. This preconditioning involves determining, while upper chamber 102 is decoupled from lower chamber 104, that certain atmospheric conditions such as a leak rate and a particle count meet certain predetermined criteria, as indicated by box 206. Leak rates and particle counts are important parameters when processing semiconductor wafers 106. Leak rates and particle counts need to be at, or within, certain levels before semiconductor wafers 106 are processed. In one embodiment, the leak rate is a maximum of one millitorr, and the particle count is a maximum of ten particles per minute. After the leak rate and the particle count reach predetermined levels, then upper chamber 102 is coupled to lower chamber 104 at step 208. Processing chamber 100 is then ready to process semiconductor wafers without having to check the leak rate and the particle count.

Preconditioning upper chamber 102 while decoupled from lower chamber 104 saves considerable time and manpower, as compared to conventional techniques, when processing semiconductor wafers. For example, if the leak rate and particle count are not known when upper chamber 102 is coupled to lower chamber 104, then the leak rate and particle count have to be checked after processing chamber 100 is put under a vacuum. If the leak rate and/or particle count is not at its predetermined value, then upper chamber 102 is reconditioned again before being coupled to lower chamber 104. The vacuum and testing procedures are performed again to make sure processing chamber 100 is ready for processing semiconductor wafers. The reconditioning of processing chamber 100 may entail cleaning upper chamber 102 again, such as with HGRS 301, thereby consuming additional time. As described above, HGRS 301 may be coupled to cart 300. One example of such a cart is shown in FIG. 3.

FIG. 3 is an elevation view of a cart 300 for preconditioning upper chamber 102 in accordance with one embodiment of the present invention. Cart 300 includes a base 302 and a support plate 304 coupled to base 302 that is operable to support upper chamber 102 of processing chamber 100. Cart 300 also includes HGRS 301 coupled to base 302 and adapted to couple to upper chamber 102, a vacuum source 319 adapted to couple to upper chamber 102, a leak rate testing source adapted to couple to upper chamber 102, and a particle count testing source 321 adapted to couple to upper chamber 102. Cart 300 may also include a vibration isolation system 312 disposed between base 302 and support plate 304.

Base 302 may be formed from any type of material and in any configuration suitable for supporting support plate 304, upper chamber 102, and additional desired equipment. Base 302 may have wheels 316, as shown in FIG. 2, to allow cart 300 to be mobile, and base 302 may have handles 314 for easy handling and transportation of cart 300. Base 302 may also have a cover 320 for protection of upper chamber 102.

Support plate 304 supports upper chamber 102 and may be formed from any type of material and in any configuration suitable for supporting upper chamber 102. In one embodiment, support plate 304 is made of aluminum. Support plate 304 may also include a heating system 318, which is used to heat upper chamber 102 to a desired temperature. This temperature may be desired for such things as alignment purposes when coupling upper chamber 102 to lower chamber 104, or for processing purposes so that upper chamber 102 is ready for processing semiconductor wafers 106 at, or near, its operating temperature, thus reducing processing time.

HGRS 301, as described above, is well known in the art of semiconductor wafer processing. In the embodiment shown in FIG. 3, HGRS 301 is coupled to base 302 and adapted to couple to upper chamber 102. HGRS 301 cleans upper chamber 102 to prepare upper chamber 102 for its next processing cycle. In one embodiment, HGRS 301 includes inlet valve 306, inlet bellows 307, riser 308, outlet bellows 309, and outlet valve 310, which work together to cycle purge gas through upper chamber 102 as shown by arrow 350. In one embodiment, the gas is a nitrogen gas that is heated to a temperature of approximately 130° C.; however, other types of gas may be used as well as other temperatures. HGRS 301 may also include other equipment to cycle purge gas through upper chamber 102.

Vacuum source 319 may be any type of vacuum source that is adapted to couple to upper chamber 102. Vacuum source 319 may or may not be coupled to cart 300. Vacuum source 319 may hold upper chamber 102 under a vacuum, or other desired pressure, for any period of time desired. Once upper chamber 102 is placed under a vacuum, or other desired pressure, upper chamber 102 may then be checked for its leak rate and particle count using leak rate testing source 320 and particle count testing source 321.

Leak rate testing source 320 may be any type of leak rate testing source adapted to couple to upper chamber 102. Leak rate testing source 320 may or may not be coupled to cart 300. Leak rate testing source 320 is used to test upper chamber 102 for a desired value of vacuum leak rate. In one embodiment, the leak rate is a maximum of one millitorr.

Particle count testing source 321 may be any type of particle count testing source adapted to couple to upper chamber 102. In one embodiment, particle count testing source 321 is an in situ particle monitor from HYT, which is well known in the art of semiconductor processing. Particle count testing source 321 may or may not be coupled to cart 300 and is used to test upper chamber 102 for a desired particle count. In one embodiment, the particle count is a maximum of ten particles per minute.

Vibration isolation system 312 may be any type of vibration isolation system suitable for isolating support plate 304 from vibrations emanating from base 302 or the environment. In one embodiment, vibration isolation system 312 comprises rubber members.

Once the leak rate and the particle count of upper chamber 102 reach desired values, upper chamber 102 may then be held under a vacuum until ready for the next processing cycle. This preconditioning allows considerable savings in semiconductor wafer processing time by having a prepared processing chamber, with a known leak rate and a known particle count, ready for substantially immediate use.

In operation, one embodiment of the present invention includes processing chamber 100 processing semiconductor wafers 106. After the process is performed, semiconductor wafers 106 are then removed. Upper chamber 102 is then decoupled from lower chamber 104 so upper chamber 102 may be cleaned. Upper chamber 102 may be placed on support plate 304 of cart 300, and HGRS 301 may circulate hot nitrogen gas to upper chamber 102 to precondition upper chamber 102 for the next processing cycle. After HGRS 301 cycle purges hot nitrogen gas through upper chamber 102, HGRS 301 is shut down and a vacuum is pulled on upper chamber 102. Then the leak rate and particle count of upper chamber 102 are checked with leak rate testing source 320 and particle count testing source 321 until predetermined values are reached. These predetermined values depend on the process for which upper chamber 102 is to be used. Once these predetermined values are reached, upper chamber 102 is held under the vacuum until ready for use. Cart 300, if it has wheels such as wheels 316, may be moved from location to location depending on where the next processing system takes place. For example, cart 300 may receive upper chamber 102 after upper chamber 102 is finished processing semiconductor wafers 106, then moved to a preconditioning station, and then moved to the next processing station. Preconditioning upper chamber 102 using mobile cart 300 allows for less downtime associated with the processing of semiconductor wafers.

Although embodiments of the invention and their advantages are described in detail, a person skilled in the art could make various alternations, additions, and omissions without departing from the spirit and scope of the present invention as defined by the appended claims.

What is claimed is:

1. A method for processing semiconductor wafers, comprising:
   processing a semiconductor wafer in a processing chamber having upper and lower chambers, wherein the upper chamber houses the semiconductor wafer and the lower chamber comprises processing equipment operable to process the semiconductor wafer;
   decoupling the upper chamber from the lower chamber;
   cleaning the upper chamber;
   determining, while decoupled, that a leak rate and a particle count for the upper chamber meets predetermined criteria; and
   coupling the upper chamber to the lower chamber.
2. The method of claim 1, further comprising placing the upper chamber under a vacuum.
3. The method of claim 1, wherein the leak rate is a maximum of one millitorr per minute.
4. The method of claim 1, wherein the particle count is a maximum of ten particles per minute.
5. The method of claim 1, wherein cleaning the upper chamber comprises cycle purging hot gas through the upper chamber with a hot gas recirculating system.
6. The method of claim 5, and further comprising coupling the hot gas recirculating system to a mobile cart, and wherein the hot gas is nitrogen.
7. The method of claim 6, and further comprising:
   coupling a vacuum source to the mobile cart and operatively coupling the vacuum source to the upper chamber;
   coupling a leak rate testing source to the mobile cart and operatively coupling the leak rate testing source to the upper chamber; and
   coupling a particle count testing source to the mobile cart and operatively coupling the particle count testing source to the upper chamber.
8. The method of claim 1, further comprising holding the upper chamber under a vacuum until the upper chamber is coupled to the lower chamber.
9. The method of claim 1, wherein processing at least one semiconductor wafer in a processing chamber comprises plasma etching.
10. A method for preconditioning a semiconductor processing chamber, comprising:
    decoupling an upper chamber from a lower chamber, the upper chamber and lower chamber forming the semiconductor processing chamber when coupled together;
    placing the upper chamber under a vacuum;
    cycle purging hot nitrogen gas through the upper chamber with a hot gas recirculating system;
    determining that a leak rate and a particle count for the upper chamber meet predetermined criteria; and
    coupling the upper chamber to the lower chamber.
11. The method of claim 10, wherein the leak rate is a maximum of one millitorr per minute.
12. The method of claim 10, wherein the particle count is a maximum of ten particles per minute.
13. The method of claim 10, wherein cycle purging hot nitrogen gas through the upper chamber with a hot gas recirculating system comprises coupling the hot gas recirculating system to a mobile cart.
14. The method of claim 13, and further comprising:
    coupling a vacuum source to the mobile cart and operatively coupling the vacuum source to the upper chamber;
    coupling a leak rate testing source to the mobile cart and operatively coupling the leak rate testing source to the upper chamber; and
    coupling a particle count testing source to the mobile cart and operatively coupling the particle count testing source to the upper chamber.
15. The method of claim 10, further comprising holding the upper chamber under a vacuum until the upper chamber is coupled to the lower chamber.

* * * * *